United States Patent [19] [11] Patent Number: 4,749,961
Kato et al. [45] Date of Patent: Jun. 7, 1988

[54] VOLTAGE CONTROLLED OSCILLATOR AND PHASE-LOCKED LOOP USING IT

[75] Inventors: Kazuo Kato, Ibaraki; Takashi Sase, Hitachi; Hideo Sato, Hitachi; Kenichi Onda, Hitachi; Ichiro Ikushima, Chigasaki, all of Japan

[73] Assignee: Hitachi, Ltd., Tokyo, Japan

[21] Appl. No.: 31,836

[22] Filed: Mar. 26, 1987

[30] Foreign Application Priority Data

Mar. 26, 1986 [JP] Japan .................................. 61-65700
Jul. 31, 1986 [JP] Japan .................................. 61-178660

[51] Int. Cl.⁴ ........................ H03L 7/14; H03K 3/281
[52] U.S. Cl. ....................................... 331/14; 331/17;
331/25; 331/34; 331/DIG. 2; 331/113 R;
331/144; 331/177 R
[58] Field of Search ....................... 331/1 A, 8, 10, 14,
331/15, 17, 18, 25, 27, 34, 113 R, 144, 177 R,
DIG. 2

[56] References Cited

U.S. PATENT DOCUMENTS 3,857,110 12/1974 Grebene ..................... 331/113 R X
4,083,019 4/1978 Hamada et al. ................. 331/113 R

*Primary Examiner*—Eugene R. LaRoche
*Assistant Examiner*—David Mis

*Attorney, Agent, or Firm*—Antonelli, Terry & Wands

[57] ABSTRACT

A voltage controlled oscillator is provided which includes a pair of gain stages constituting a positive feedback path, a pair of buffer stages in cross connection with the gain stages, a pair of loads connected with the corresponding gain stages, each having a parallel connection of an active device resistor and a clamping diode, and a pair of voltage controlled current sources connected with the corresponding gain stages, for supplying constant currents to the gain stages. A timing capacitor is connected with the input sides of both voltage controlled current sources, and is charged or discharged by the constant currents from the current sources. The oscillator further includes a pair of variable bias generating means, connected with the corresponding buffer stages, for generating variable bias voltages are provided, each of which varies the bias voltage to be applied to the corresponding active device in accordance with the output of the corresponding buffer stage in such a manner that the bias voltage is properly set in accordance with the constant current value of said constant current source so as to set the on-resistance of said active device to a suitable value corresponding to the constant current value. With this arrangement the loop gain of the VCO is made constant regardless of the constant current value.

20 Claims, 13 Drawing Sheets (a) REFERENCE INPUT (b) OUTPUT OF COUNTER 600

(c) OUTPUT OF COUNTER 650

(d) OUTPUT OF T/V CONVERTER CIRCUIT 440

(e) OUTPUT FREQUENCY f OF VCO

VOLTAGE CONTROLLED OSCILLATOR AND PHASE-LOCKED LOOP USING IT

BACKGROUND OF THE INVENTION

This invention relates to a voltage controlled oscillator, and, more particularly, to a voltage controlled oscillator which can oscillate high frequency signals with high accuracy, linearity and stability, and a phase lock device using such an oscillator.

As one type of voltage controlled oscillator, an emitter coupled multivibrator has been proposed in a entitled book "BIPOLAR AND MOS ANALOG INTEGRATED CIRCUIT DESIGN", by A. B. Grebene published by John Wiley & Sons Inc. 1984, p571-575. This oscillator, when clamped under the operation condition of $2I_oR2Vd$ ($I_o$: constant current at a voltage controlled current source, R: resistance of a load, Vd: drop voltage of a clamping diode), provides an oscillation frequency f obtained by the following equation:

$$f = I_o/4C \cdot Vd \tag{1}$$

where C is a timing capacitance.

(1) Voltage controlled oscillators (hereinafter referred to as VCO) are generally desired to meet the requirements of (a) being capable of oscillating with a wide frequency range, (b) low power consumption or dissipation and (c) stability irrespective of various disturbance.

In order to oscillate higher frequency signals, the value of C should be smaller with the value of Vd fixed, as understood from Equation (1). To meet the above requirement of low power consumption, however, $I_o$ must be as small as possible so that the value of C must be smaller still.

Meanwhile, the conventional VCO, formed in the form of an IC without building-in a timing capacitor in an IC chip, provided poor noise endurance. To obviate it, it has been proposed by the inventors of the present invention to build-in the timing capacitor in the IC chip. Thus, since the timing capacitance C is fixed, the oscillation frequency can be controlled by varying the current $I_o$.

Nevertheless, the oscillation of VCO is not stabilized since the loop gain Gl of this VCO, represented by $R/2re = RqI_o/2kT$ (T: absolute temperature, k: Boltzmann constant, re: emitter resistance) also changes with the current $I_o$ (q/kT is constant with T fixed).

Thus, such a VCO meeting the requirements of (a)-(c) and having a fixed loop gain has been desired to be developed.

(2) Further, the conventional VCO encounters problems that the oscillation frequency f varies or fluctuates due to the fact that Vd varies with T, and that it cannot provide stabilized oscillation operation when the power supply voltage is low, e.g., less than 5 V.

(3) a VCO has been desired to be able to set a stabilized center frequency of the oscillation.

(4) The conventional phase-locked loop (hereinafter referred to as PLL) using a VCO has the following problems. The conventional PLL adopts, as means for holding the frequency in the VCO when input signals disappear, means of switching the VCO input to a sample-and-hold circuit with a large time constant and replacing the input signal by the output signal from a quartz oscillator, as disclosed in e.g. JP-A-No. 57-160244. However, when the sample-and-hold circuit has a large time constant, the rising of the output frequency in the VCO, after the input signal has reappeared, is retarded so that the output frequency in the VCO is stabilized late. The frequency holding means is so complicated and expensive that it is not suitably implemented in the form of a monolithic integrated circuit.

SUMMARY OF THE INVENTION

A first object of this invention is to provide a voltage controlled oscillator (VCO) which can oscillate high frequency signals with high accuracy, linearity and stability.

A second object of this invention is to provide a voltage controlled oscillator (VCO) which can oscillate high frequency signals stably irrespective of disturbance with a stabilized loop gain at low power consumption.

A third object of this invention is to provide a voltage controlled oscillator (VCO) which can perform a stabilized oscillation in spite of temperature change.

A fourth object of this invention is to provide a voltage controlled oscillator (VCO) which permits a stabilized center oscillation frequency to be set.

A fifth object of this invention is to provide a phase-locked loop (PLL) having frequency holding means well implemented in a monolithic IC which can hold the output frequency of the VCO at a predetermined oscillation frequency when input signals disappear.

In order to attain the first and second objects, there is provided a VCO comprising a pair of gain stages, constituting a positive feedback path, a pair of buffer stages in cross connection with the gain stages, a pair of loads connected with the corresponding gain stages, each having a parallel connection of a resistor and a clamping diode, a pair of voltage controlled current sources connected with the corresponding gain stages, for supplying constant currents to the gain stages, and a timing capacitor connected with the input sides of both voltage controlled current sources, which is charged or discharged by the constant currents from the current sources, wherein said resistor of the load is an active device, a pair of variable bias generating means, connected with the corresponding buffer stages, for generating variable bias voltages are provided, each of which varies the bias voltage to be applied to the corresponding active device in accordance with the output of the correspondihg buffer stage, in such a manner that the bias voltage is properly set in accordance with the constant current value of said constant current source so as to set the on-resistance of said active device to a suitable value corresponding to the constant current value, whereby the loop gain of said VCO is made constant regardless of the constant current value.

In order to attain the first and third objects, in accordance with this invention, there is provided a VCO in which the operation current is constant-current-controlled by taking, as a reference voltage, the directly detected voltage across a clamping diode, or the equivalent clamping voltage which is detected by detecting the voltage drop across a diode connected in series with the VCO.

In order to attain the first and fourth objects, in accordance with this invention, there is provided a VCO including means for linearizing the input/output characteristic and applying a prescribed input value to the VCO so as to oscillate the VCO at a predetermined frequency.

In order to attain the fifth object, in accordance with this invention, there is provided a PLL (phase locked loop) comprising a variable frequency oscillator the oscillation frequency of which varies in accordance with an input voltage or current, a phase comparator which produces an output in accordance with the phase difference between the output of the variable frequency oscillator and a reference input which are supplied thereto, and a converter which converts the output of the phase comparator into a D.C. signal and inputs the signal to the variable frequency oscillator, in which there is further provided means for, when the reference input disappears, supplying a prescribed input to the variable frequency oscillator so as to hold the oscillation frequency at a predetermined frequency.

DESCRIPTION OF THE PREFERRED EMBODIMENTS

Prior to explaining a first embodiment of the VCO according to this invention, the prior art VCO to which the first embodiment is to be applied will be explained with reference to FIGS. 1 to 3.

Figure 1:
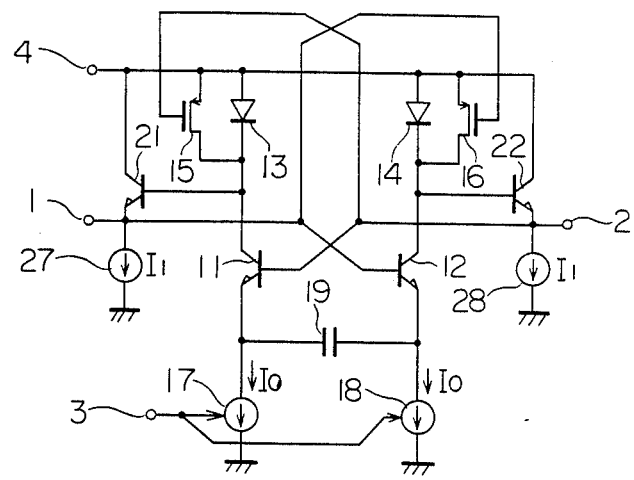
FIG. 1 is a circuit diagram of VCO to which a first embodiment of this invention is to be applied.
Figure 2:
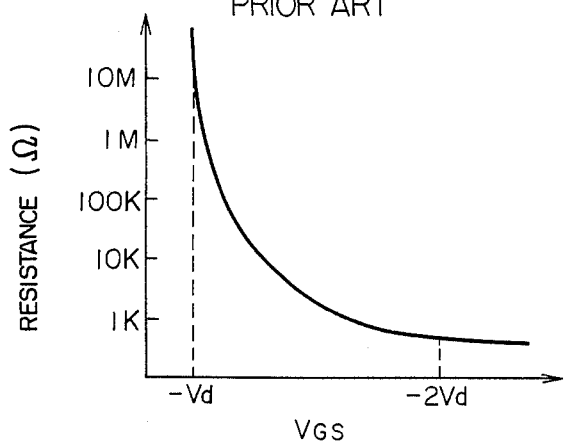
FIG. 2 is a graph showing the characteristic of MOS elements employed in FIG. 1.

FIG. 1 shows the prior art VCO which is similar to that disclosed in Japanese Patent Unexamined Publication No. 60-12870-9 (JP-A- No. 60-128709).

As previously mentioned, the oscillation frequency f in the conventional emitter coupled multivibrator type of oscillator is represented by Equation (1).

In order that the oscillator can operate over a wide range of frequency, the resistance of the resistor R must be set so that the necessary oscillation f is at the lower limit, i.e. the constant current $I_o$ is at a minimum value. To this end, R must be set to a value as large as possible in the above operation condition.

In Equation (1), the base current IB is ignored for the reason that the current amplification factor is very large. In the present case, however, the base current IB cannot be ignored since the resistance R is too large. Thus, considering the base current IB, Equation (1) is represented by $$f = I_o AC(Vd - IB \cdot R) \tag{2}$$

Figure 11:
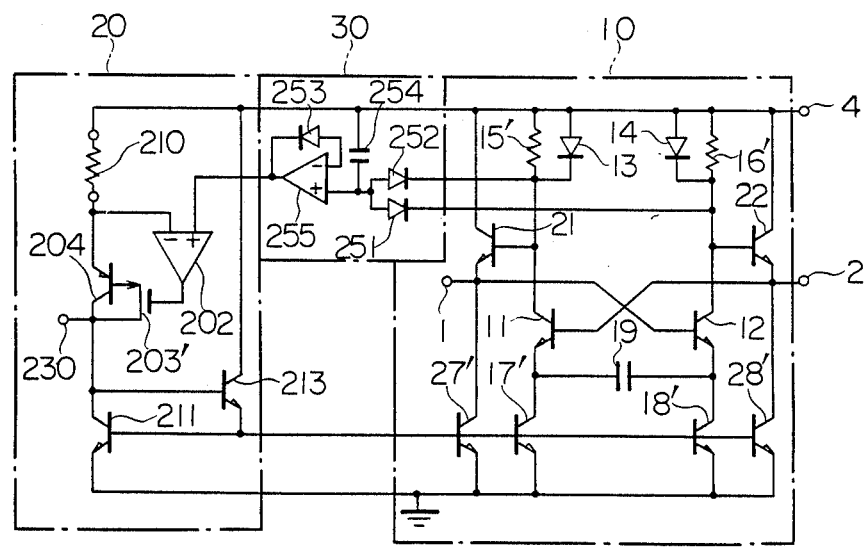
Figure 12:
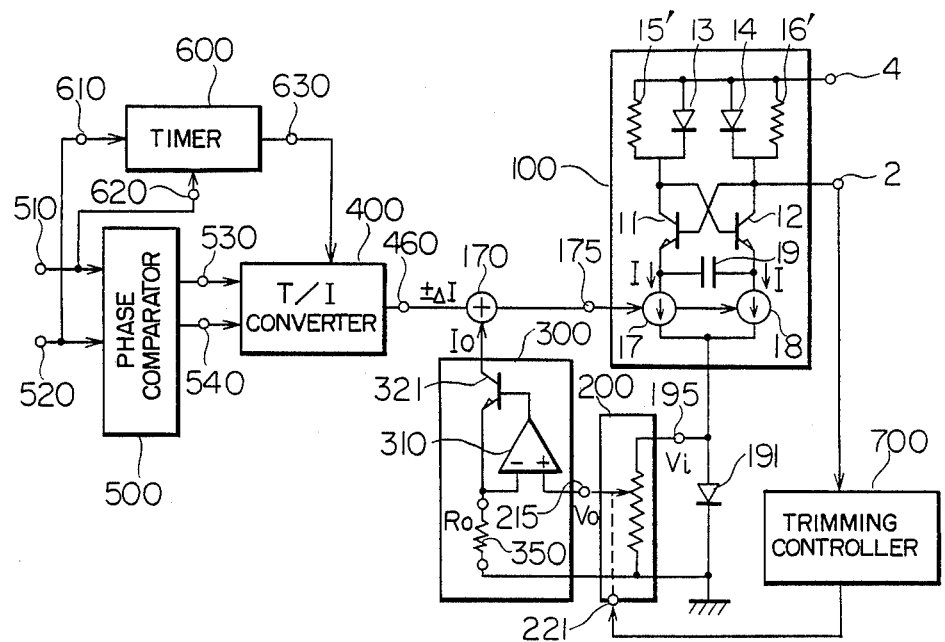
FIG. 12 is a circuit diagram showing a PLL according to a third embodiment of this invention.

As is apparent from this equation, f is influenced from the variation of IB (i.e. variations of B due to the variations of the oscillation frequency and temperature). This makes it difficult to operate the oscillator with high stability over a wide range of frequency. To obviate such a difficulty, there has been proposed the emitter coupled multivibrator type VCO operating at a constant current power supply, as shown in FIG. 1, which is less influenced from base current variation and also assures the stabilized operation over a wide range of frequency. In FIG. 1, 11 and 12 are transistors which constitute a couple of gain stages. The collector of the transistor 11 is connected with a load consisting of a clamping diode 13 and an active device, e.g. MOS device (preferably MOS transistor) 15 and also connected with an emitter follower buffer stage consisting of a transistor 21 and a constant current source 27 through a power supply terminal 4. On the other hand, the collector of a transistor 12 is connected with a load consisting of a clamping diode 14 and an active device, e.g. MOS device (preferably MOS transistor) 16 and also connected with an emitter follower buffer stage consisting of a transistor 22 and a constant current source 28 through the power supply terminal 4. Incidentally, the constant current sources 27 and 28 supply the same current value.

The base of the transistor 11 is connected with the gate of the MOS device 15, the emitter of the transistor 22, and a second output terminal 2. On the other hand, the base of the transistor 12 is connected with the gate of the MOS device 16, the emitter of the transistor 21 and a first output terminal 1. The first and second output terminals provide output waveforms with the phases opposite from each other.

The emitter of the transistor 11 is connected with one terminal of a timing capacitor 19 and a voltage controlled current source 17. On the other hand, the emitter of the transistor 12 is connected with the other terminal of the timing capacitor 19 and a voltage controlled current source 18. The voltage controlled current sources 17 and 18 are both connected with a control terminal 3 which supplies the same control voltage thereto.

The operation of the circuit of FIG. 1 is as follows. Now assuming that the transistor 11 is off and the transistor 12 is on, the base potential of the transistor 12 is Vcc−Vd (Vcc represents a power supply voltage applied to the power supply terminal 4, and Vd generally represents the drop voltage of the clamping diodes 13 and 14 and the base-emitter voltage of each of the transistors 11, 12, 21 and 22, and the emitter potential thereof is Vcc−2Vd. On the other hand, the base potential of the transistor 11 is Vcc−2Vd. Then, the gate of the MOS device 15 is applied by the potential of −2Vd while the gate of the MOS device 16 is applied by the potential of −Vd so that the resistances of the MOS devices 15 and 16 become an on-resistance $R_{on}$ (low resistance) an off-resistance $R_{off}$ (high resistance), as seen from the graph of FIG. 2 showing the characteristic of the gate voltage vs. resistance in the MOS device. Through the transistor 12, the sum $2I_o$ of the constant currents from the voltage controlled current sources 17 and 18 ($I_o$ is a set current in the current sources 17 and 18) flows. This current $2I_o$ is divided into one component $I_o$ which is pulled directly from the emitter of the transistor 12 into the current source 18 and the other component $I_o$ which is pulled into the current source 17 through the timing capacitor 19. Thus, the emitter potential of the transistor 11 is decreased at the slope of $I_o/C$ (C is the capacitance of the timing capacitor). When this emitter potential becomes Vcc−3Vd or less, the transistor becomes on since the base potential is Vcc−2Vd. Thus, the current of $2I_o$ starts to flow through the transistor 11 instead of the transistor 12 and when accordingly the emitter potential of the transistor 11 becomes Vcc−2Vd, the transistor 12 is turned off. Then since the emitter potential is increased by Vd from Vcc−3Vd to Vcc−2Vd, the increase of Vd is also transmitted to the transistor 12 through the timing capacitor 19, thereby placing the emitter potential of the transistor 12 at Vcc−Vd. Taking the above mentioned operation as a half cycle, the transistors 11 and 12 are alternately turned on to repeat the oscillation.

Figure 3:
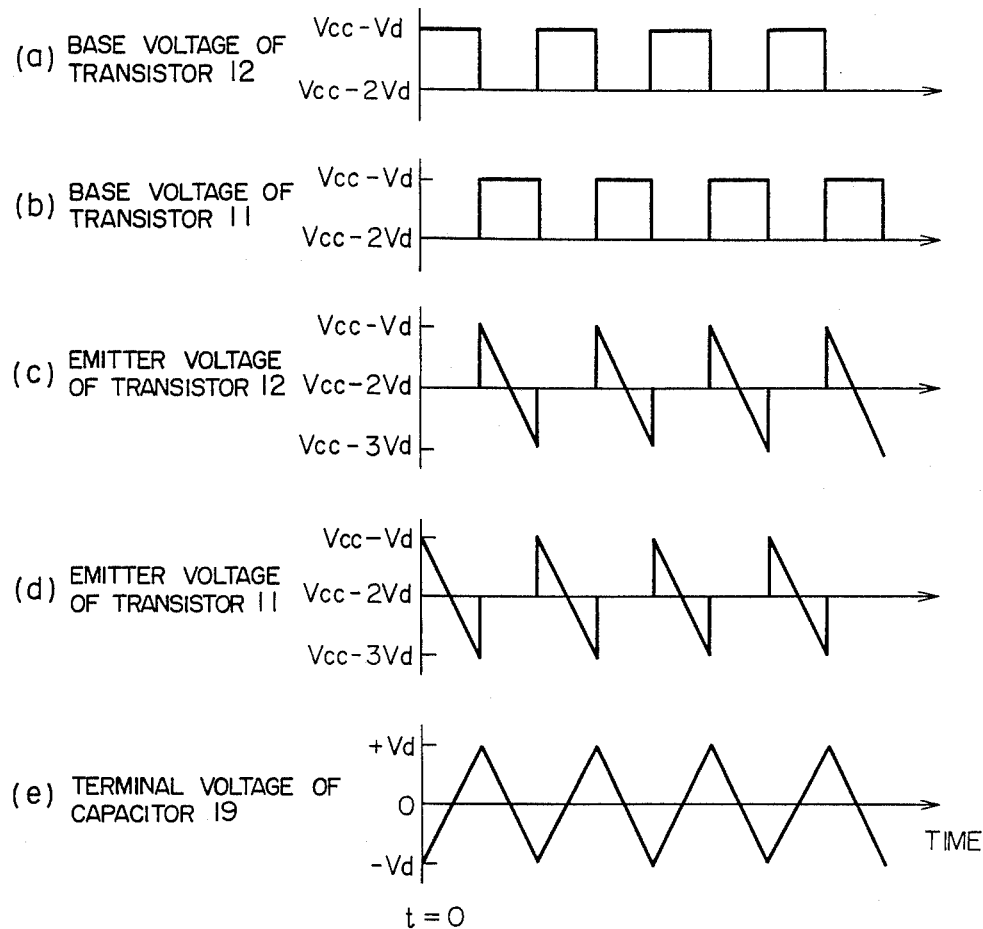
FIG. 3 is a waveform chart showing the signal waveforms at the respective positions of the circuit of FIG. 1.

The signal waveforms at the respective positions of the circuit of FIG. 1, explaining the above operation, are shown in FIG. 3. (a) illustrates the signal waveform at the first output terminal 1; (b) illustrates the signal waveform at the second output terminal 2, i.e. the voltage waveform at the base of the transistor 11; (c) illustrates the voltage waveform at the emitter of the transistor 12; (d) illustrates the voltage waveform at the emitter of the transistor 11; and (e) illustrates the voltage waveform across the timing capacitor 19.

In the above operation, the MOS devices 15 and 16 can be directly driven by the outputs (Vcc−Vd) and (Vcc−2Vd) from the corresponding emitter follower buffer stages, respectively. Therefore, the operation condition, $2I_oR \geq Vd$ when the transistor 12 or 11 is on is satisfied since R can be increased to a value as large as R off; the operation condition, $IB \cdot R << Vd$ when the transistor 11 or 12 is off is also satisfied since R can be decreased to a value as small as $R_{on}$, and hence the term of IB·R can also be decreased correspondingly.

In this way, by driving the active devices of the loads so that when the one gain stage is on, the active device of the corresponding load is off while the active device of the load corresponding to the other gain stage is on since the other gain stage is off, the operation conditions of $2I_o \cdot R_{off} \geq Vd$ and $IB \cdot R_{on} << Vd$ are satisfied, so that the influence from the base current IB is attenuated, thereby improving the frequency characteristic and temperature characteristic of VCO.

Further, if, in addition to the above two conditions, the conditions of $2I_o \cdot R_{on} \geq Vd/n$ (n: integer e.g. 2) and $R_{on} C_s < 1/m \cdot f$ (Cs: parasitic capacitance of the load, f: oscillation frequency of the VCO, m: integer, e.g. 8) are satisfied, the switching characteristic of the oscillator is improved, thereby improving the frequency characteristic of the VCO.

If the constant current linked with the constant current $I_o$ of the current source is supplied to the means of driving the active devices mentioned above, when $I_o$ is small, the base current IB can also be decreased, thereby improving the current accuracy of $I_o$.

Meanwhile, the oscillation operation of the VCO can be stabilized by maintaining the loop gain Gl constant for the constant current of the current source. Namely, in the VCO shown in FIG. 1, as seen from Equation (1), in order to oscillate high frequency signals, the value of C is desired to be as small as possible. Also, since $I_o$ is required to be small for the requirement of low power consumption, the value of C is desired to be further small. Further, in order to maintain the operation of the VCO stable irrespective of disturbance, it is preferable to build-in a timing capacitor together with the circuit of FIG. 1 in an IC chip. If the timing capacitor is built-in in the chip, the value thereof is fixed so that the oscillation frequency is controlled by varying $I_o$. However, since the loop gain Gl of VCO is represented by $RqI_o/2KT$, Gl varies with varying $I_o$, thus making the oscillation of the VCO unstable. Therefore, if Gl is fixed for $I_o$, the oscillation of VCO can be stabilized.

The loop gain Gl can be fixed by providing suitable gate voltage adjusting means in the circuit of FIG. 1. When the emitter resistance of the transistors and 12 is re and the on-resistance of the MOS devices 15 and 16, $Gl = R_{on}/2re$ and $re = kT/gI_o$. Thus, it has been noticed by the inventors of this invention that since re is inversely proportional to $I_o$, Gl can be fixed for $I_o$ by setting the value of $R_{on}$ in proportion to re. To this end, there is provided in FIG. 1 means for adjusting the gate effective voltage to be applied to the MOS devices so that $R_{on}$ of the MOS device corresponds to $I_o$ which is set so as to provide a desired oscillation frequency f. This gate effective voltage Vg (eff) to be applied to the MOS devices by the gate voltage adjusting (applying) means is obtained, after having obtained $R_{on}$ corresponding to the desired $I_o$ from the graph showing the $I_o$ vs. $R_{on}$ characteristic relative to the loop gain Gl, from Equation (3):

$$R_{on} = 1/\beta V_{G(eff)} - V_{DS}/2 \quad (3)$$

where $V_{DS}$ is the source-drain voltage of the MOS device and $\beta$ is the current amplification factor of the transistors 11 and 12.

Figure 5:
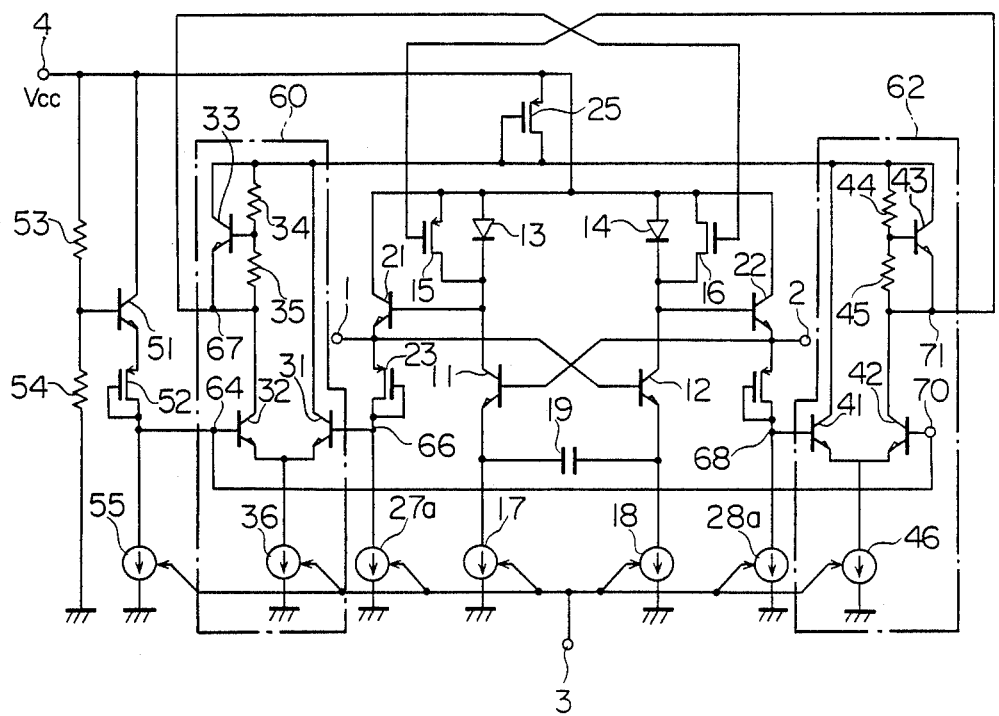
FIG. 5 is a circuit diagram of a VCO according to the first embodiment of this invention.
Figure 6:
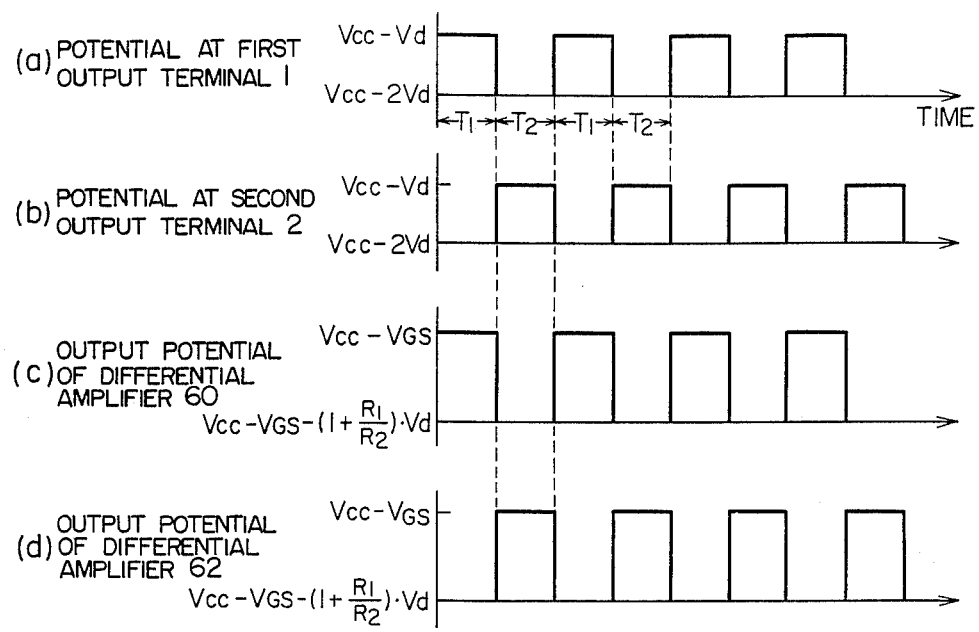
FIG. 6 is a waveform chart showing the signal waveforms at the respective positions of the circuit of FIG. 5.
Figure 7:
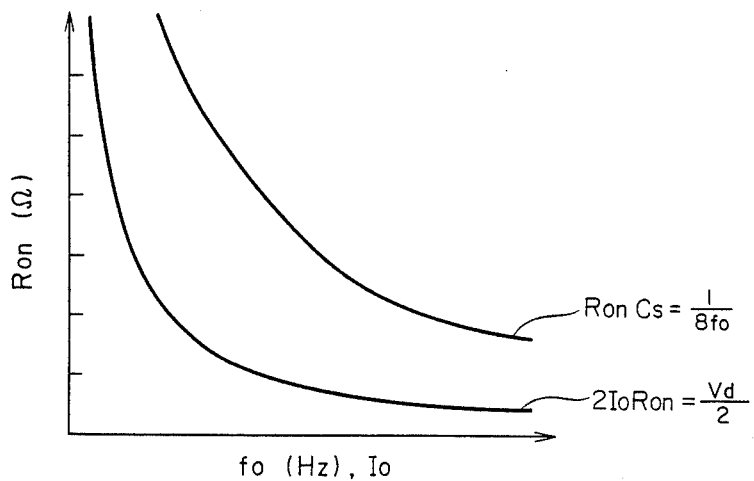
FIG. 7 is a graph showing the preferable region of the on-resistance of the active devices employed in the first embodiment.

A first embodiment of this invention which is constituted on the basis of the above technical idea is shown in FIG. 5 in which like reference numerals refer to like function elements in FIG. 1.

The circuit of FIG. 5 is similar to that of FIG. 1 except that a pair of differential amplifiers 60 and 62 are provided as means for driving the MOS devices 15 and 16 (gate voltage applying means) so that the outputs thereof are in cross-connection with the corresponding MOS devices 15 and 16 to set the on-resistance of the MOS devices to a predetermined value.

More specifically, the differential amplifier 60 consists of transistors 31, 32 with their emitters commonly connected with a voltage controlled current source 36; a transistor 33 with its collector connected with the power supply 4 through a MOS transistor 25 (in a diode connection) and its emitter connected with the collector of the transistor 32; a resistor 34 connected between the collector and base of the transistor 33 and a resister 35 connected between the base and emitter of the transistor 33. One input terminal 66 of the differential amplifier 60 is connected with the output of the corresponding buffer stage, i.e. the emitter of the transistor 21 through a MOS transistor 23; the other input terminal 64 thereof is connected with the output of a reference voltage generating circuit (consisting of a transistor 51, a MOS transistor 52 in diode connection, resistors 53, 54 and a voltage controlled current source 55), i.e., the drain of the MOS transistor 52. The output terminal 67 of the differential amplifier 60, i.e., the emitter of the transistor 33 is connected with the gate of the MOS transistor 16.

On the other hand, the differential amplifier 62 consists of transistors 41, 42 with the emitters commonly connected with a voltage controlled current source 36; a transistor 43 with its collector connected with the drain of the MOS transistor 25 and its emitter connected with the collector of the transistor 42; a resistor 44 connected between the collector and base of the transistor 43; and a resistor 45 connected between the base and emitter of the transistor 43. One input terminal 68 of the differential amplifier 62 is connected with the output of the corresponding buffer stage, i.e. the emitter of a transistor 22 through a MOS transistor 24; the other input terminal 70 is connected with the output of the reference voltage generating circuit. The output terminal 71 of the differential amplifier 62, i.e., the emitter of the transistor 43 is connected with the gate of the MOS transistor 15.

In the circuit arrangement of FIG. 5 as mentioned above, the operation of the differential amplifier 60 will be explained.

First, in the state where the transistor 12 is on while the transistor 11 is off, the transistor 21 is on and the potential at the first output terminal 1 is Vcc−Vd and the transistor 31 becomes on. Thus, the transistor 32 becomes off, and the output potential at the output terminal 67 of the differential amplifier 60 becomes the collector potential (Vcc−$V_{GS}$) of the transistors 31 and 33 (where Vcc is the power supply voltage applied to the terminal 4 and VGS is the gatesource voltage of the MOS transistor 25). Accordingly, Vcc−$V_{GS}$ is applied to the gate of the MOS transistor 16. On the other hand, in the state where the transistor 11 is on while the transistor 12 is off, the transistor 21 is off and the potential at the first output terminal 1 is Vcc−2Vd. Thus, the transistor 31 becomes off and the transistor 32 becomes on so that the potential at the output terminal 67 is Vcc−$V_{GS}$−$V_{CE}$·$V_{CE}$, which is the collector-emitter voltage of the transistor 33, is represented as $V_{CE}$=(1+$R_1/R_2$)Vd (where Vd is the base-emitter voltage of the transistor 33 and $R_1$, $R_2$ are resistances of the resistors 34, 35, respectively). Accordingly, Vcc−$V_{GS}$−(1+$R_1/R_2$)Vd is applied to the gate of teh MOS transistor 16.

The differential amplifier 62 operates in the same manner as mentioned above.

FIG. 5 shows the waveforms of the potentials at the first and second output terminals and at the output terminals of the differential amplifiers 60 and 62. In this figure, $T_1$ and $T_2$ denote the periodes when the transistors 12 and 11 are on.

In this way, by controlling the gate voltage to be applied to the MOS transistors 15 and 16 in accordance with the states of the corresponding transistors 11 and 12 so as to control the on-resistance $R_{on}$ of the MOS transistors 15 and 16, the loop gain of the $V_{CO}$ is stabilized irrespective of current value $I_o$ and the switching characteristic of the transistors 11 and 12 can be improved.

More specifically, the switching characteristic of the transistors 11 and 12 can be improved by meeting the following requirements on the on-resistance of the corresponding MOS transistors 15 and 16.

(1) the trigger condition of completely inversing the transistor 11 or 12 from the off state to the on state is $2I_oR_{on} \geq Vd/n$ (n is preferably 2), and (2) considering the parasitic capacitance CS of the collector of the transistor 11 or 12, the condition of the time constant where the collector of the transistor 11 or 12 is pulled up to the power supply voltage is $R_{on}$·CS < 1/$mf_o$ (m is preferably 8).

The boundary lines of $R_{on}$ meeting these desirable operating conditions are shown by curves in the graph showing the $R_{on}$ vs. oscillation frequency $f_o$ and operation current $I_o$ of the VCO. It will be seen that the desired value of $R_{on}$ varies in accordance with the oscillation f and so the constant current $I_o$. Therefore, by previously adjusting the ratio between the values of the resistors 34 and 35 and between the values of resistors 44 and 45, the gate voltage to be applied to the MOS transistors 15 and 16 and hence $R_{on}$ can be set to any value, thereby setting $R_{on}$ to satisfy the above-described desirable operating condition in accordance with the oscillation frequency. Thus, the loop gain of the VCO can be stabilized irrespective of a current value $I_o$ and the switching characteristic of the transistors 11 and 12 can be improved.

Further, in this embodiment, voltage controlled current sources 17, 18, 27a, 28a, 36, 46 and 55 are all controlled by the common control voltage applied to a terminal 3, which contributes to good oscillation. The current ratio between the current sources 27a, 28a and 55 and the current sources 36 and 46 is preferably 1:2.

Moreover, the MOS transistor 25 having the same characteristic as that of the MOS transistors 15, 16 is connected in parallel with the MOS transistors 15 and 16 and in series with the differential amplifiers 60 and 62. Therefore, when the gate voltage of the MOS transistors 15 and 16 varies due to the variation of ambient temperature, the source voltage, etc. the gate voltage of the MOS transistor 25 also varies correspondingly, thereby permitting the gate driving amplitude of the MOS transistors to be not influenced from the temperature variation, etc.

Furthermore, the differential amplifiers 60 and 62 includes a pair of transistors 31, 32, and a pair of transistors 41, 42, respectively, and the inputs of the differential amplifiers 60 and 62 are connected with a pair of MOS transistors 23, 52 and a pair of MOS transistors 24, 52, respectively. This also contributes to the immunity of the gate driving amplitude to the temperature variation, etc.

Incidentally, instead of the MOS transistor 25, a constant current source may be connected in parallel with the constant current sources 36 and 46. A resistor in place of the transistor 33, and the resistors 34, 35 may be employed to provide the gate driving amplitude through its voltage drop. Any other suitable semiconductor device in place of the MOS transistor may be used. This embodiment can be applied to not only the emitter coupled multibirator VCO but also the other VCO's.

Now referring to FIGS. 8 to 11, a second embodiment of this invention will be explained.

As object of this embodiment is to solve the problem that in the conventional VCO when the temperature T varies, which changes the drop voltage of a clamping diode, the oscillation frequency also varies, and particularly the problem that a stable oscillation operation can not be performed when the power supply voltage is set low.

In order to attain such an object, in accordance with this embodiment, the operation current of the VCO is constant-current-controlled by taking, as a reference voltage, the directly detected voltage across the clamping diode in the VCO, or the equivalent clamping voltage of VCO which is detected through a diode connected in series of the oscillation circuit.

Figure 4:
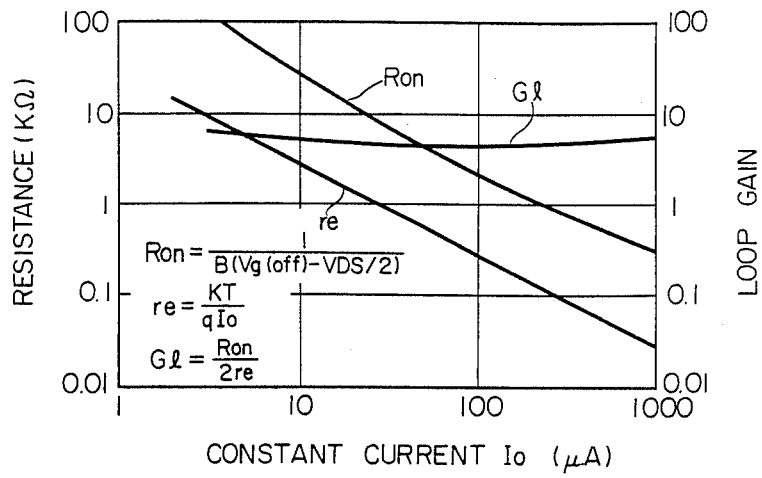
FIG. 4 is a graph showing the loop gain of VCO.
Figure 8:
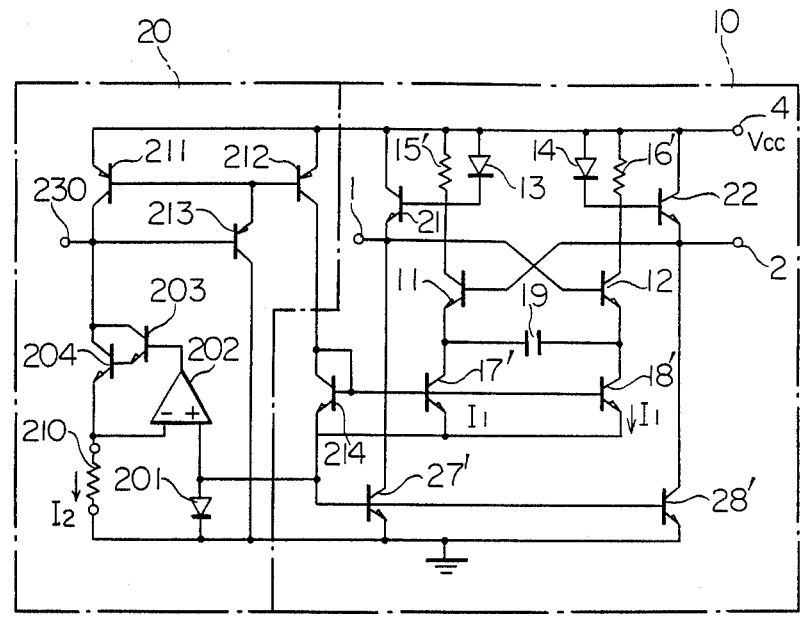
FIG. 8 is a circuit diagram of a VCO according to a second embodiment of this invention.

The second embodiment will be explained with reference to FIG. 8. In FIG. 8, like numerals refer to like element in FIGS. 1 and 4. More specifically, in FIG. 8, the section generally indicated by 10 has substantially the same arrangement as the emitter coupled multivibrator VCO part as shown in FIGS. 1 and 4 except that resistors 15', 16' are used in place of the MOS transistors 15 and 16 in FIGS. 1 and 4 and transistors 17', 18', 27', 28' are used in place of the transistors 17, 18, 27, 28 in FIG. 4. The emitter current of the transistors 17' and 18' is controlled using a transistor 214 in diode connection. The oscillation frequency f of the oscillator part 10 is represented by $$f = I_1/4 \cdot C \cdot V_{d1} \qquad (4)$$

where $I_1$ is the current flowing through the transistors 17' and 18' serving as a constant current source, C is the capacitance of the capacitor 19, and $V_{d1}$ is the forward voltage drop across the voltage clamping diodes 13 and 14.

A bias control circuit section generally indicated by 20 consists of a diode 201 connected between the oscillator section 10 and a power source ground so as to equivalently detect the clamping voltage across the diodes 13 and 14 in the oscillator part 10; a diode 210 for setting the oscillation frequency; a differential amplifier 202 for amplifying the differential voltage between the voltages across the diode 201 and the resistor 210; a composite circuit consisting of transistors 203 and 204 for supplying a current to the resistor 210, and a current mirror stage for base current compensation consisting of transistors 211, 212 and 213 and having, as an input, the current flowing the oscillation frequency setting resistor 210. The output of the current mirror stage, i.e. the collector of the transistor 212 is connected with both the collector and base of the input transistor 214 in the current mirror stage in the oscillator part 10. A terminal 230 in the bias control circuit 20 supplies the control current in accordance with set oscillation frequency. The anode of the diode 201 having the same characteristic as that of the clamping diodes 13 and 14 is connected with both the emitters of the transistors 17' and 18' so that if the emitter current of the transistors 17' and 18' is $I_1$, the current of $2I_0$ flows through the diode 201.

The operation of the circuit of FIG. 8 constructed as mentioned above will be explained. When minute current (1 μA or less) is passed between the control input terminal 230 and ground through an activating resistor (not shown), this current is supplied to the input transistor 214 of the oscillator section 10 through the transistors 211 and 212 at the current mirror stage whereby the transistors 17' and 18' constituting a constant current circuit becomes on and so the operating current of the oscillator section flows. This operating current flows through the diode 201 to provide the forward voltage drop Vd thereacross. The differential amplifier 202 amplifies the differential voltage between the drop voltage $V_D$ across the diode 201 and the voltage across the resistor 210 and increases the current flowing through the resistor 210 through the transistors 203 and 204 so that the differential voltage becomes zero. The increased current is fed back to the diode 201 through the current mirror stages of the bias control circuit section 20 and the oscillator section 10 and finally the balancing state of the oscillator section 10 is obtained.

The control loop as mentioned above, which is a positive feedback, is small in its positive feedback coefficient because the saturation non-linearity of the voltage for the current is large, so that there is no fear of making the control loop unstable.

In the steady state of the circuit of FIG. 8, the oscillation frequency f in the oscillator section 10 is represented by the above Equation (4). On the other hand, the current $I_2$ flowing through the resistor 210, generated in the bias control circuit section 20, is represented by $I_2 = V_{D2}/R$ (where $V_{D2}$ is the voltage across the diode, and R is the resistance of the resistor 210). Assuming that such a proportion coefficient in the control loop as making $I_2$ equal to the constant current $I_1$ in the oscillator section is K, $I_1$ is represented by $$I_1 = K \, V_{D2}/R \qquad (5)$$

From Equations (4) and (5), the oscillation frequency f is represented by $$f = K/4CR \cdot V_{D2}/V_{D1} \qquad (6)$$

If the diodes 13, 14 in the oscillator section 10 are made equal to the diode 201 of the bias control circuit section in their current density, $V_{D1} = V_{D2}$. Then, the oscillation frequency is not influenced from the temperature in the diode. On the other hand, if they are not equal in their current density, a differential voltage $\Delta V_D$ results between $V_{D1}$ across the clamping diodes 13, 14 and $V_{D2}$ across the diode 201 so that the oscillation frequency is represented by $$f = K/4CR \, (1 + \Delta V_D/V_D) \qquad (7)$$

Therefore, the respective current densities of the diodes in the oscillator section 10 and in the bias control section 20 are selected to be as equal as possible by changing the ratio of the size (or number) of the diodes at both sections. More specifically, the difference in current density is set in the range of 20% or less considering the stability of the oscillation frequency (temperature influence).

In the embodiment of FIG. 8, the sum of the operation voltages of all the devices connected between the power supply terminal 4 and ground is $5V_D$ if the forward voltage drop across each device is $V_D$. Therefore, even if a higher estimation of $V_D = 0.9$ V or so is made, the circuit of FIG. 8 can be designed and operated using a single power source of 5 V.

Further, in the embodiment of FIG. 8, the diode 201 for providing the reference voltage in the bias control circuit section 20, which defines the center frequency in the oscillator section 10, is connected in series with the oscillator section 10 and the voltage source, so that the current density thereof is well matched with those of the clamping diodes 13, 14 in the oscillator section 10 even if the operation frequency range is varied.

Further, the circuit for converting the forward voltage across the reference diode 201 into current is close-loop controlled by the differential amplifier 202 so that the characteristics of the high input impedance, high gain and low offset of the differential amplifier can be more preferably obtained than the conventional V/I conversion circuit system using transistors, thereby improving the current setting precision, temperature stability, etc. The oscillator section 10 can be operated in a wide range of frequencies since all the transistors included therein are of an NPN type.

Figure 9:
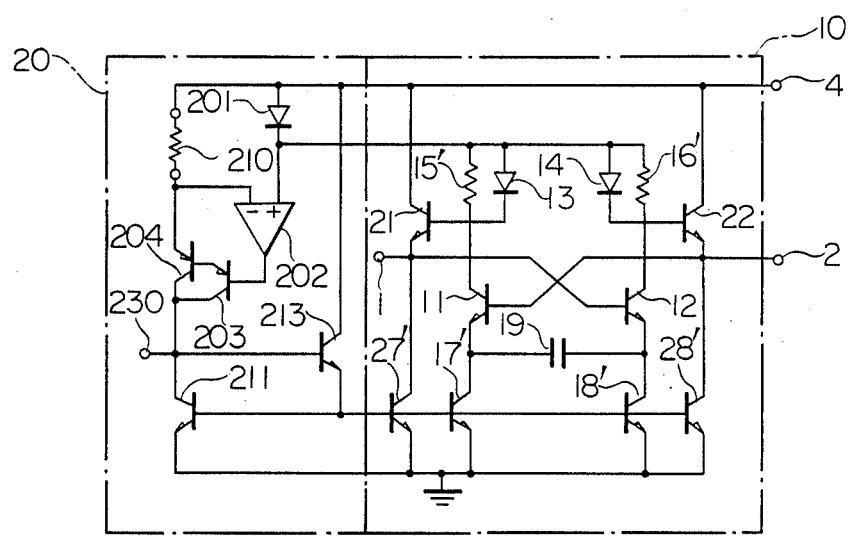
FIGS. 9 to 11 are circuit diagrams of modifications of the second embodiment.

One modification of the second embodiment of this invention is shown in FIG. 9. The circuit of FIG. 9 is the same as that of FIG. 8 except that the reference diode 201 in the bias is inserted at the side of the plus (+) power supply in the oscillator section 10. More specifically, the anode of the diode 201 is connected with the terminal 4 and the cathode thereof is connected with the anodes of the clamping diodes 13 and 14 so that the entire current flowing the diode 201 becomes the operation current in the oscillator section. Also, the current flowing through the resistor 210 flows through the current mirror stage of the bias control circuit section 20 and controls the transistors 17', 18', 27' and 28' serving as a constant current source.

In this modification, the diodes 201 and the diodes 13, 14 are arranged adjacently to each other in a circuit arrangement so that the transistor 214 in FIG. 8 becomes unnecessary. Thus, the current flowing through the transistor 214 can be removed. Accordingly, the current densities can be correctly matched between the diode 201 and the diodes 13, 14, thereby attenuating the temperature influence for the oscillation freqeuncy.

Figure 10:
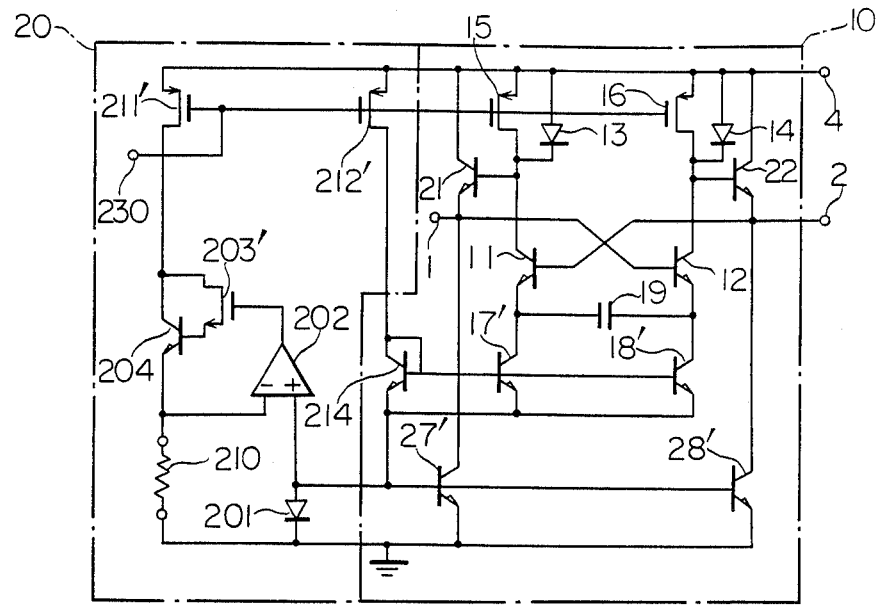

Another modification of the second embodiment is shown in FIG. 10. The circuit of FIG. 10 is different from the circuits of FIGS. 8 and 9 only in that MOS transistors are employed in place of the bipolar transistors and the resistors in FIGS. 8 and 9. By using MOS transistors 203', 211' and 212' in place of the bipolar transistors 203, 211 and 212, the influence from the base current and its variation of the bipolar transistors can be completely eliminated. Also, by using MOS transistors 15 and 16 in place of the resistors 15' and 16' in the oscillator section, these MOS transistors 15 and 16 can be operated as variable resistors which are controlled by the bias voltage for an MOS transistor 211' at the current mirror stage in the bias control section 20. The advantage of varying the pull-up resistors in the oscillator section in accordance with the operation that the operation current can be maintained with a constant ratio for the current flowing through the clamping diodes 13 and 14 even if the oparation range is varied. Thus, the current densities between the diodes can be maintained with a fixed ratio, thus enabling a wider frequency range operation. Further, the MOS transistors, having a better frequency characteristic than bipolar lateral PNP transistors and having no junction, enable the pull-up with less voltage loss.

A further modification of the second embodiment is shown in FIG. 11. In this modification, without providing the reference diode in the bias control circuit section 20, the clamping diodes 13 and 14 in the oscillator section 10 are used as reference diodes. To this end, there is newly provided a diode voltage detecting circuit 30 for detecting the forward voltage across the clamping diodes 13 and 14. The diode voltage detecting circuit 30, as shown, consists of input rectifying diodes 251, 252, a capacitor 254 for holding the peak voltage, a differential amplifier 255, and a diode 253 for compensating for the forward voltage drop across the diodes 251 and 252. The non-inverting input of the differential amplifier 255 is connected with both anodes of the diodes 251 and 252, a diode 253 is connected between the inverting input and the output, and the output is connected with the non-inverting input of the differential amplifier 202. The diode detecting circuit 30 rectifies and smooths the A.C. like voltage waveform generated in the clamping diodes 13 and 14 in the oscillator section 10 and provides a D.C. voltage at the output of the differential amplifier 255. Thus, if the diodes 251, 252 and 253 have the forward characteristic, the difference between the power supply voltage and the output voltage of the differential amplifier 255 is equal to the forward voltage drop across the clamping diodes 13 and 14 so that the bias control section 20 provides a bias current using as a reference voltage the output voltage of the differential amplifier 255, and so the forward voltage drop across the clamping diodes 13 and 14.

The modification of FIG. 11 has at least two advantages. One is that since the bias control section 20 generates the constant current using as a reference the forward voltage across the clamping diodes, the ratio $I/V_D$ of the forward voltage $V_D$ of the diodes to the constant current I is maintained constant regardless of the current density of the diodes and so the oscillation frequency is not subjected to the variation due to the forward voltage across the diodes. The second advantage is that since the sum of the operation voltages of the four diodes equivalently connected in series is $4V_D$, the circuit of FIG. 11 can be operated using the source voltage less than 5 V.

The diode voltage detecting circuit in FIG. 11 may also be any suitable circuit, e.g. a sample-and-hold circuit, other than the circuit as shown.

In accordance with the second embodiment of this invention, the operation voltage of the D.C. circuit elements can be decreased to e.g. 4–5 V so that the VCO can be operated using a single power source of 5 V, so that the VCO can be economically integrated together with logic circuits, etc. Also, since the forward voltage drop to be collected of the clamping diodes is directly or through the diode connected in series thereof, the collecting effect can be enhanced. This contributes to the stabilizing of the oscillation frequency in cooperation with the fact that the bias current flowing toward the oscillator is close-loop controlled. The oscillator section which can be constituted without using PNP transistors enables a high frequency operation.

Of course, this second embodiment can be applied to not only an emitter coupled multivibrator VCO but also other VCO's.

Now referring to FIGS. 12 to 23, a third embodiment of this invention will be explained. This embodiment relates to a PLL using the VCO such as shown in any one of FIGS. 1 to 11, and more particularly to a PLL having frequency holding means (which can be suitably implemented in a monolithic IC) which can hold the output frequency of VCO at a prescribed oscillation frequency when input signals disappear.

FIG. 12 shows a circuit diagram of PLL according to this embodiment. In this figure, 100 generally indicated is VCO as shown in any one of FIGS. 1 to 11 (only the main components are shown for brevity of illustration); 191 is a diode connected with the constant current sources 17 and 18 of the VCO; 200 is a voltage dividing circuit for dividing the voltage $V_i$ of one terminal of the diode 191; 300 is a constant current circuit for producing the current I in accordance with the output voltage $V_O$ of the voltage dividing circuit 200; 400 is a T/I (time/current) conversion circuit; 500 is a phase comparator; 600 is a timer (counter); and 700 is a trimming control circuit.

The respective elements included in each of the above circuits will be explained together with their function. The diode 191 connected in series with the current sources 17, 18 of VCO 100 serves to compensate for the non-linearity and temperature influence of the input/output characteristic due to the diodes 13 and 14 of the VCO. The voltage dividing circuit 200 connected between both ends of the diode 191 through the terminal 195 has a trimming input terminal 221. This terminal 221 is connected with a trimming control device 700, including a logic tester, for detecting the frequency difference between the output frequency from the output terminal of VCO 100 and the central frequency thereof in order to instruct a trimming amount. The output terminal 215 of the voltage dividing circuit 200 is connected with the constant current circuit 300. The output current $I_0$ therefrom is connected with an input terminal 175 of VCO 100 through one input of a current adding circuit 170 to control the operation current in VCO 100. The constant current circuit 300 is constituted by a closed loop circuit consisting of a differential amplifier 310, a transistor 321 and a setting resistor 350. The output current $I_0$ therefrom is set to the value obtained by dividing the voltage it the terminal 215 by the resistance $R_0$ of the resistor 350. This output current $I_0$ defines the center frequency in VCO 100, i.e. the oscillation frequency in inverse proportion to the resistance $R_0$ of the resistor 350.

Further, the other input of the current adding circuit 170 is connected with the T/I (time/current) conversion circuit 400 for passing the current in proportion to a phase difference. The phase comparator 400 and the timer (counter) 600 are connected with the input side of the T/I conversion circuit 400. The phase comparator 500 provides UP and DOWN pulse voltages to their output terminals 530 and 540, respectively; the UP and DOWN pulse voltages have the pulse width in proportion to the phase difference between two A.C. signals of an input signal (reference input) applied to one input terminal 510 and a feedback signal from the output terminal 2 of VCO 100, applied to the other input terminal 520. The phase comparator 500 may be known several circuits in accordance with the property of the signals to be compared. The timer 600 is a known counter consisting of a clock input terminal 610, a reset input terminal 620 and an output terminal 630. When any reset signal (input signal) is not supplied to the terminal 620 until the number of clock input pulses (signals from the output terminal 2 of VCO 100) supplied to the terminal 610 exceeds the number of counts at a prescribed count stage, a time-out signal is produced at the output terminal 630. When the timeout signal is produced, the T/I conversion circuit 400 doesn't produce an output so that only the output current $I_0$ from the constant current circuit 300 is supplied to the terminal 175, thus oscillating VCO 100 at the frequency defined by $I_0$.

Incidentally, the counting time in the timer 600 is set to a value longer than the maximum continuous unvarying time of the input signals. All the circuit elements of FIG. 12 other than the trimming control device 700 and the setting resistor 350 in the constant current circuit 300 are integrated on the same chip, so that the resistor 350 has to be only provided to completely perform the oscillation operation. The trimming control device 700, including a logic tester, is inserted only during the trimming period, and during this period the input signal and the feedback signal from the output terminal 2 of the VCO are not applied to the terminals 510 and 520, respectively. Further, the feedback from the output terminal 2 to the input terminal 520 is performed when the circuit of FIG. 12 is served as a PLL; this feedback may be performed not only directly from the terminal 2 to the terminal 520 but also indirectly through a gain circuit or 1/n voltage dividing circuit, as previously known.

Figure 13:
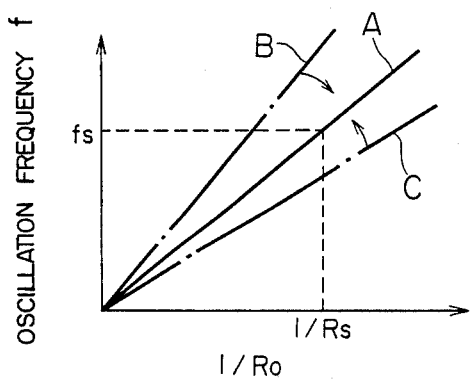
FIG. 13 is a graph showing the frequency characteristic of a VCO of FIG. 12.

FIG. 13 shows the frequency characteristic of VCO 100 in the PLL arrangement of FIG. 12. By changing the voltage dividing point of the voltage dividing circuit 200, including a trimming circuit by means of the trimming control device 700, the oscillation frequency f is trimmed to be a prescribed frequency $f_s$ when the resistance $R_0$ is a predetermined value $R_S$ as indicated by the characteristic A in FIG. 13. Therefore, the frequency characteristics of VCO 100 such as indicated by B and C, after the trimming, are quantized and normalized as the characteristic A. Thus, the influence of the variation of the used circuit elements for the frequency characteristic can be eliminated and also the oscillation frequency f can be precisely set to the center frequency by means of the resistance $R_0$ of a single setting resistor 350. Incidentally, since the resistance $R_0$ of the setting resistor 350 and the oscillation frequency f of VCO 100 are in inverse proportion to each other, it is simple and convenient that the trimming is made to such a gain as both are in a complementary relation to each other in binary notation.

Figure 14:
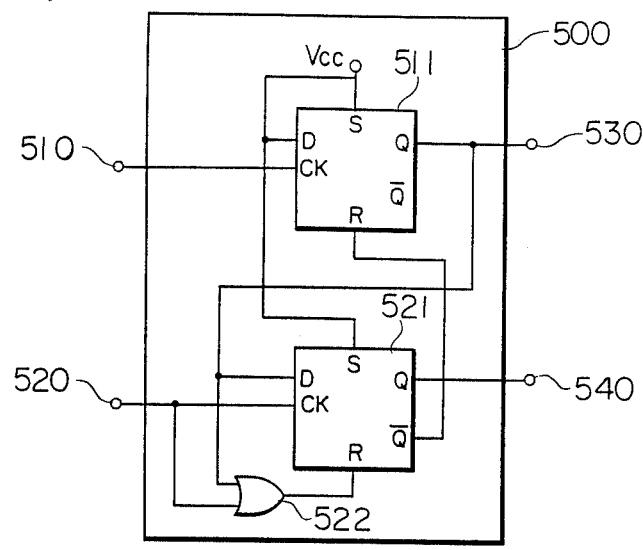
FIG. 14 is a circuit diagram showing the phase comparator used in FIG. 12.

FIG. 14 is a circuit diagram showing one example of the phase comparator 500 in FIG. 12. In FIG. 14, the phase comparator 500 is a known circuit consisting of D-type flip-flops 511, 521, and an OR-gate 522.

Figure 15:
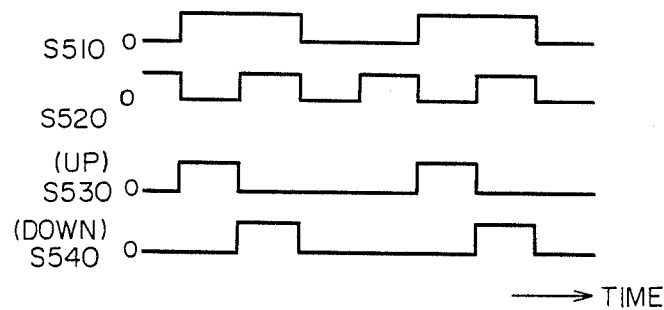
FIG. 15 is a waveform chart relative to the phase comparator of FIG. 14.

FIG. 15 is a waveform chart of the operation waveforms in the circuit of FIG. 14. In this figure, S510 is the waveform of an input signal (signal at the input terminal 510); S520 is the waveform of the signal from the output terminal 2 of VCO 100 (signal at the input terminal 510); S530 is the UP pulse voltage (voltage at the output terminal 530); and S540 is the waveform of the DOWN pulse voltage (voltage at the output terminal 540). As seen from FIG. 16, there are provided, at the output terminals 530 and 540, the UP and DOWN pulse voltages having the pulse width in proportion to the phase difference between the input signal (reference input) S510 and the VCO output signal S520 which are applied to the input terminals of the phase comparator 500 of FIG. 15, respectively.

Figure 16:
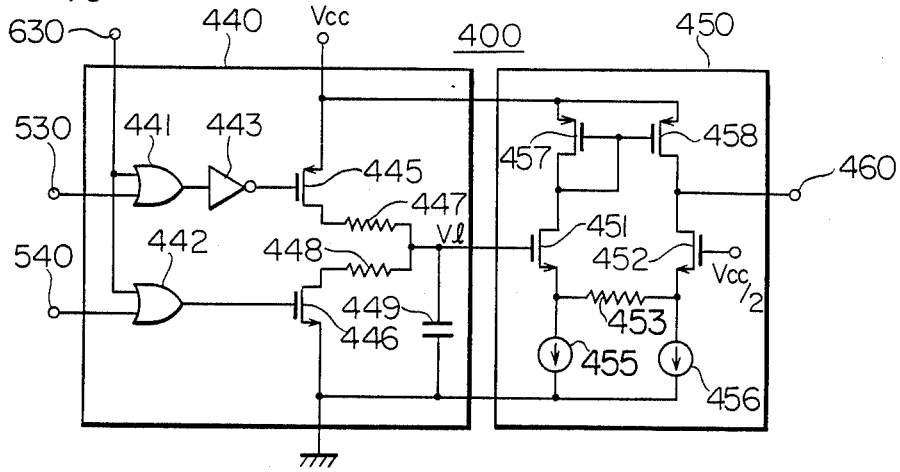
FIG. 16 is a circuit diagram of the T/I conversion circuit used in FIG. 12.

FIG. 16 is a circuit diagram showing one example of the T/I conversion circuit 400. In FIG. 16, 440 generally indicated is a T/V (time/voltage) conversion circuit; 441, 442 is an OR gate, 443 is an inverter; 445 is a P-channel MOS transistor; 446 is an N-channel MOS transistor; 447, 448 is a resistor; and 449 is a capacitor. 450 generally indicated is a V/I (voltage/current) conversion circuit; 451, 452 is an N-channel MOS transistor; 453 is a resistor; 455, 456 is a constant current circuit; and 457, 458 is a P-channel MOS transistor.

The T/I conversion circuit 400 of FIG. 16 consists of the T/V conversion circuit 440 and the V/I conversion circuit 450. The UP and DOWN pulse voltages (FIG. 15) from the phase comparator 500 (FIG. 14) are applied to the input terminals of the T/V conversion circuit 440. These UP and DOWN pulse voltages are differentially integrated by a circuit consisting of the MOS transistors 445, 446 serving as switching elements, resistors 447, 448 and capacitor 449 so as to be converted into a voltage $V_I$ (the conversion gain is Vcc/2RC where R is the resistance of the resistors 447, 448 and C is the capacitance of the capacitor 449). This voltage of $V_I$ is converted into a current $\Delta I$ by the V/I conversion circuit 450 consisting of the transistors 451, 452, resistor 453, constant current circuits 455, 456 and transistors 457, 458 and the current $\Delta I$ is provided at the output terminal 460 (the output current $\Delta I$ is $(V_I-V_{cc}/2)/R453$ (where R 453 is the resistance of the resistor 453)).

Further, the T/V conversion circuit 440, is so arranged that the transistors 445, 446 are made conductive not only by the UP and DOWN pulses from the input terminals 530 and 540 but also by the time-out signal from the output terminal 630 of the timer 600 of FIG. 12. Namely, when the time-out signal is supplied from the timer 600, the transistors 445, 446 are simultaneously turned on to provide the output voltage $V_I$ of the circuit 440 which is approximately Vcc/2. Then, the gate voltage of both the MOS transistors 451 and 452 is Vcc/2, and so the differential output from the output terminal is zero.

In this way, if the output frequency of VCO is trimmed without applying the input signal to the input terminal 510, the time-out signal is sent to the T/I conversion circuit 400 and the differential output therefrom is applied to the adding circuit 170 so that the output characteristic of VCO can be trimmed in accordance the variation of the output characteristic of T/I conversion circuit 400.

Figure 17:
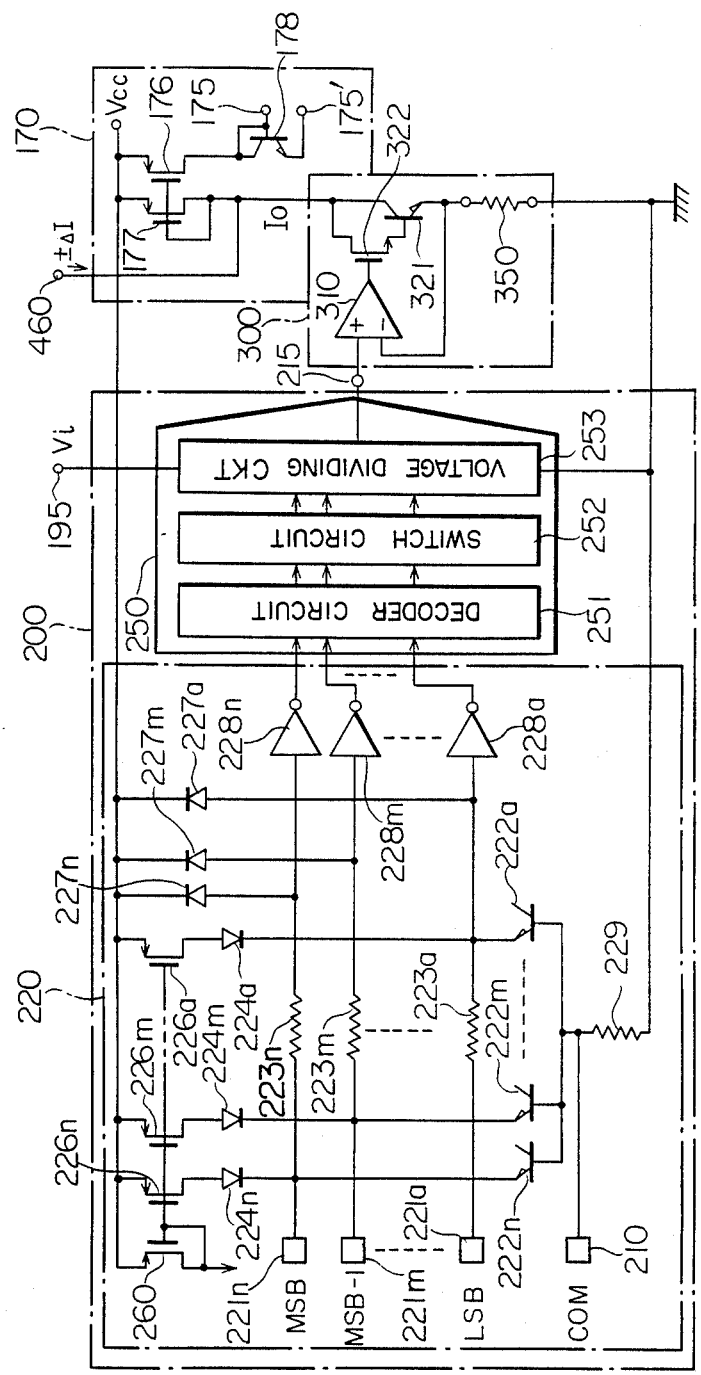
FIG. 17 is a circuit diagram of the voltage divider of FIG. 12.

FIG. 17 is a circuit diagram showing one example of a circuit including the voltage dividing circuit 200 which includes a ROM serving as a trimming circuit. In the voltage dividing circuit 200 of FIG. 17, 210 (COM) and 221a (LSB) to 221n (MSB) are trimming input terminals (pads for inputting a trimming signal); 220 is a ROM, 222a to 222n are ROM transistors; 223a to 223n are resistors; 224a to 224n are diodes; 260, 226a to 226n are constant current transistors; 228a to 228n are inverters; 250 is a D/A converter circuit; 251 is a decoder circuit; 252 is a switching circuit; and 253 is a voltage dividing circuit (a series of resistors). The current adding circuit 170 consists of transistors 176, 177 and 178.

The ROM 220 serving as a trimming circuit consists of transistors 222a to 222n (constituting a ROM) corresponding to respective bits, constant current transistors 226a to 226n for supplying minute reverse bins currents to the emitter-base junctions of the corresponding ROM transistor 222a to 222n inverters 228a to 228n for shaping the output levels of the corresponding ROM transistors 222, diodes 227a to 227n and 224a to 224n for breakdown voltage protection, resistors 227a to 227n for current limitation, and trimming input terminals 210, 221a to 221n (pads for inputting a trimming signal). The reverse bias currents to be supplied to the ROM transistors 222a to 222n are set to such a value as the reverse bias voltage is sufficiently established and also the emitter-base junction of each ROM transistor is not injured, e.g. several $\mu A$'s to 10 $\mu A$ or so. The threshold value of each of the inverters 228a to 228n is set to a value smaller than the insurance value of the breakdown voltage of each ROM transistor 222, e.g. about 1 to 2 V.

The write of ROM 220 can be performed by applying the positive voltage of +15 V, 10 mA max or so to the trimming input terminals 221a (LSB) to 221n (MSB) for the common base terminal 210 (COM). When the voltages are applied to some of the trimming input terminals, the corresponding ROM transistors 222a to 222n are decreased in their ohmic resistance from about 1 k$\Omega$ to several hundreds $\Omega$ because of the junction breakdown due to injected energy. Then, the terminal voltages (emitter voltages) of the ROM transistors become sufficiently lower than the threshold value of the inverters 228a to 228n. In this way, the write of the ROM transistors is completed. Accordingly, the outputs of the ROM transistors subjected to the writein become a low voltage level while those of the ROM transistors not subjected to the write-in become a high voltage level.

The D/A converter circuit 250, which is basically a multiplication type, consists of the voltage divider (a series of resistors) 253, switching circuit 252 for selecting a dividing point and decoder circuit 251. The D/A converter in accordance with the code input from the inverters 228 divides the voltage Vi applied to the terminal 195 of the voltage divider (a series of resistors) 253 and sends the resultant voltage to the output terminal 215. The output voltage of the D/A converter circuit 250 is converted into the output current $I_0$ by the constant current circuit 300 consisting of a differential amplifier 310, transistors 321, 322 and a setting resistor 350. This output current $I_0$ is added to the current $\pm \Delta I$ from the output terminal 460 of the T/I conversion circuit 400 (FIG. 16) in the current adding circuit 170 as a current mirror stage consisting of transistors 176, 177 and a transistor 178 in diode connection. The resultant current is applied to the input terminal 175 of VCO 100 (FIG. 12) through the transistor 178 in diode connection to control the constant current circuits 17 and 18, thereby changing the oscillation frequency in VCO 100.

Figure 18:
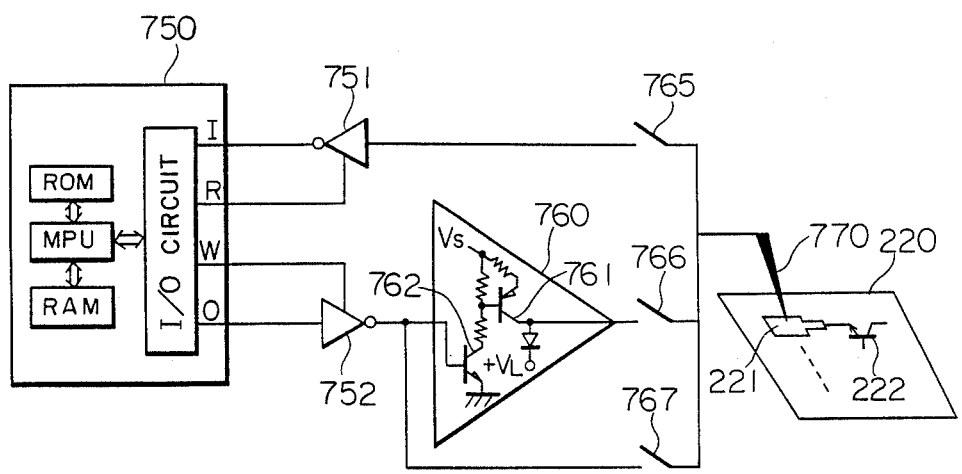
FIGS. 18 and 19 are block diagrams of the trimming control device shown in FIG. 12.
Figure 19:
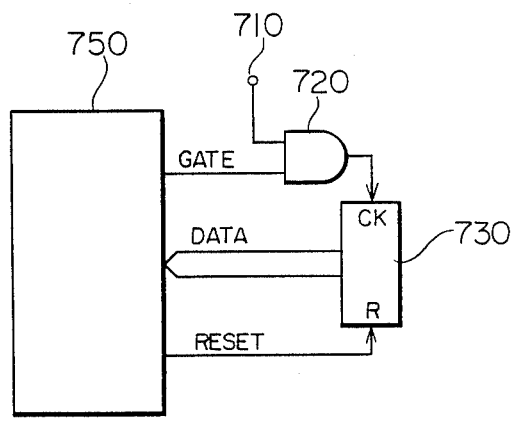

FIGS. 18 and 19 show one example of the trimming control device 700 in block form. FIG. 18 shows an arrangement which can perform the write, pseudo write and test ROM 220; FIG. 19 shows a frequency measuring circuit for measuring the output frequency of VCO prior to the writing. In FIGS. 18 and 19, 750 is a logic tester (digital tester) including an MPU (microprocessing unit), ROM, RAM and I/0 circuit. In FIG. 18, 751, 752 is a inverter gate (driver gate); 760 is a pulse amplifier; 761, 762 is a transistor in the amplifier 760; 765, 766, 767 is a relay; and 770 is a write probe. In FIG. 19, 710 is an input terminal for input the output frequency from the output terminal 2 of VCO; 720 is an AND gate; and 730 is a binary counter.

There are three routes between the logic tester 750 and the write probe 770 via the relays 765 to 767. The first route serves to test the ROM input pads (trimming input terminals) 221 through the relay 765 and the inverter 751. The second route is a pseudowrite route for providing a low potential to the trimming input terminal 221 so as to temporarily place them at a low potential level. The third route serves to apply a high voltage (+15 V) to the trimming input terminals 221 through the inverter 752, pulse amplifier 760 and relay 766. The output of the pulse amplifier 760 for write operation is pulses of the voltage of 15 V, current of 10 mA and pulse width of 1 ms or so which enable the write.

The circuit for measuring the output frequency of VCO prior to the write, as shown in FIG. 19, includes the AND gate 720 and counter 730 in addition to the commonly used logic tester. The frequency signal from the output terminal 2 of VCO is supplied to the input terminal 710 of the gate 720. Therefore, the output frequency of the VCO can be measured by supplying from the logic tester to the gate the signal for setting a predetermined gating time, counting the output pulses of VCO during the set time by the counter 730 and reading the counting value by the logic tester.

Figure 20:
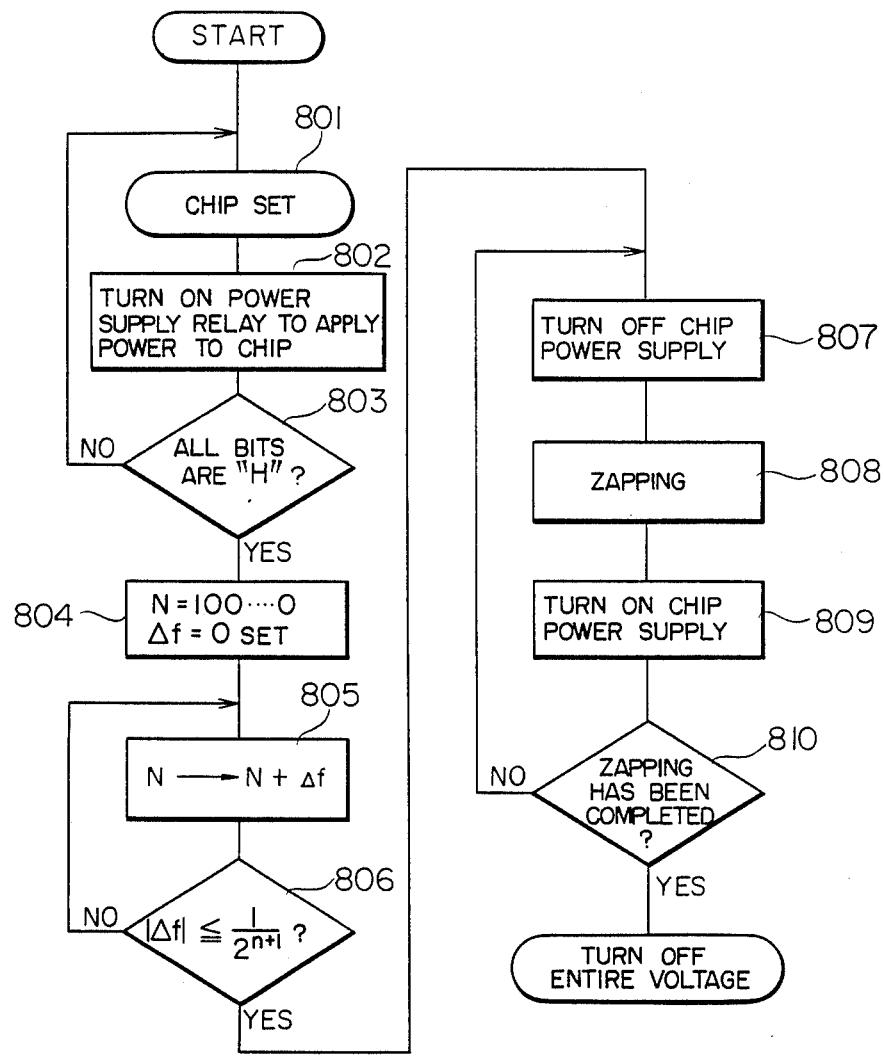
FIG. 20 is a flowchart showing the operation of the trimming control device shown in FIG. 12.

FIG. 20 shows the flowchart of one example of the control operation of the trimming control device 700 shown in FIG. 12 (or FIGS. 17 to 19). This control operation is carried out in accordance with the program stored in ROM in the logic tester 750. Now referring to FIG. 20, the trimming operation of the trimming control device 750 will be explained in detail. First, in Step 801, the pin (probe) 770 is set onto a chip (ROM 220) to be subjected to the trimming. In Step 802, power is supplied to the chip by turning on a power supply relay (not shown). In Step 803, the relay 765 is closed and then all the voltages of the trimming input terminals 221a to 221n are read out through the probe by the logic tester 750 in order to confirm if all the bits from the trimming input terminals are "H" (high level). Even if only one bit is "L" (low level), it means that this chip (ROM 220) is in initial failure so that the probe setting is again made to the other chip (ROM 220). Steps 801 to 803 are again performed. If all the bits are "H", in Step 804, an intermediate value (N=100 ... 0), and difference $\Delta f=0$ are set as initial values of pseudo-write input code N of ROM 220. More specifically, the relay 767 is closed to supply the bit data (100 ... 0) to the trimming input terminals 221a to 221n from the logic tester 750 and set in RAM of the tester 750 the initial value of the difference between the output frequency f of VCO and the center frequency $f_0$, i.e. $\Delta f=0$. The initial value N corresponds to the voltage dividing ratio of about ½. In Step 805, N is shifted to $N+\Delta f$. Now, since $\Delta f$ is 0, $N+\Delta f=N$. In Step 806, the oscillation frequency of VCO 100 is measured to provide a difference of from the central frequency $f_0$ in order to judge if the difference $\Delta f$ is larger than a prescribed trimming accuracy ($\pm \frac{1}{2}$LSB of N bits). If the answer is NO, N is again set to $(N+\Delta f)$ in Step 805. Thereafter Step 806 is also executed again. Namely, in Step 805 the pseudo-write input code of $(N+\Delta f)$ is applied to the trimming input terminals 221, and in Step 806 the oscillation frequency f of VCO 100 is again measured to provide $\Delta f$ in order to make the same judgement. In this case, if the D/A conversion circuit 250 has good linearity, $\Delta f$ will be converged by one attempt of Steps 805 and 806. Even if it has poor linearity, $\Delta f$ will be swiftly decreased so that $\Delta f$ will be converged by two or three attempts of Steps 805 and 806. Thus, the measurement will be completed in a short time. Then, if the difference $\Delta f$ becomes within the allowable limit (trimming accuracy), in Step 807, the power source of the chip is switched off. In Step 808, zapping is executed in such a manner that the junctions of the ROM transistors 222 corresponding to the final set data N are broken. This can be performed by applying high voltage zapping pulses, corresponding to the final set data N with $\Delta f$ converged, to the trimming input terminals 221, in a state where the relay 766 is closed. In Step 809, power is applied to the chip. In Step 810, checking is made on if the zapping is completely made. That is, with the relay 765 closed, the voltages of the zapped trimming input terminals 221 are read out, and the checking is made on if the read voltages correspond to the final data N. If the correspondence is not obtained, the zapping is executed again assuming that the write of the data N is insufficient. If the correspondence is obtained, the trimming for the chip is completed.

In this way, since the output voltage of the D/A converter 250 becomes the value obtained by multiplying the output voltage $V_i$ of the VCO applied to the terminal 195 by the voltage dividing ratio defined by the final data N, the output frequency characteristic of the VCO can be trimmed like the line A shown in FIG. 13, thereby permitting the output frequency f to correspond to the central frequency $f_0$.

The trimming process as mentioned above includes the step of confirming the trimming of a chip (ROM 220), so that it can be surely executed. The trimming time may be as short as 1 sec. or so.

Figure 21:
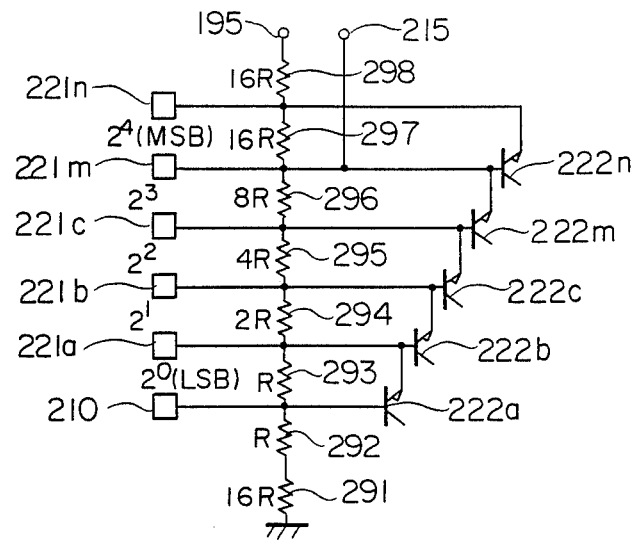
FIG. 21 is a circuit diagram showing another example of the voltage dividing circuit shown in FIG. 12.

FIG. 21 shows another example of the voltage dividing circuit 200 in FIG. 12. In FIG. 21, the trimming input terminals 221a to 221n are connected with the emitters of the corresponding ROM transistors 222a to 222n and also connected with resistors 291 to 298. The resistors 291 to 298 have resistances R to 16 weighted as indicated.

The voltage dividing circuit 200 of FIG. 21, showing the example in which the voltage dividing ratio data N consists of 5 bits and the output voltage can be varied within the range of ±25%, has an advantage that it can be adapted to both the voltage division and variable resistor since the weighted resistors 291 (16R) to 298 (16R), which reduce the number of the circuit components used, are used in the voltage dividing circuit (series of resistors). However, since the resistance of the transistors 222 after the zapping is required to be made sufficiently smaller than the unit resistance R, and also the zapping voltages must be differentially applied, the zapping is more difficult to perform than in the case of FIG. 17. Incidentally, the form of the voltage dividing circuit or variable resistor can be modified as required. Further, the methods of blowing the fuse on polysilicon as on-chip trimming elements and laser-cutting aluminum wiring (although it cannot be performed by means of a typical electric tester) may be employed.

As described above, in accordance with this embodiment, by adjusting the voltage dividing ratio of the voltage dividing circuit 200 using the trimming control device 700 so as to control the control current $I_0$ from the constant current circuit 300 to the terminal 175 of the VCO, the oscillation frequency f of VCO can be stabilized to the center frequency.

On the other hand, in the case where this embodiment is adapted to PLL, when the input signal is normally supplied to the terminal 510 of the phase comparator 500, the sum of the output current $\Delta I$ of the T/I conversion circuit 400 in accordance with the feedback input from the output terminal 2 of VCO to the terminal 520 and the output current $I_0$ of the constant current circuit 300 is supplied to the VCO to control the oscillation frequency of the VCO. When the input signal to the terminal 510 disappears during a prescribed period, the time-out signal is applied to the T/I conversion circuit 400. Then, the circuit 400 doesn't produce any current, so that only the current $I_0$ is supplied to the VCO, thereby setting the oscillation frequency of the VCO to the control frequency $f_0$.

Figure 22:
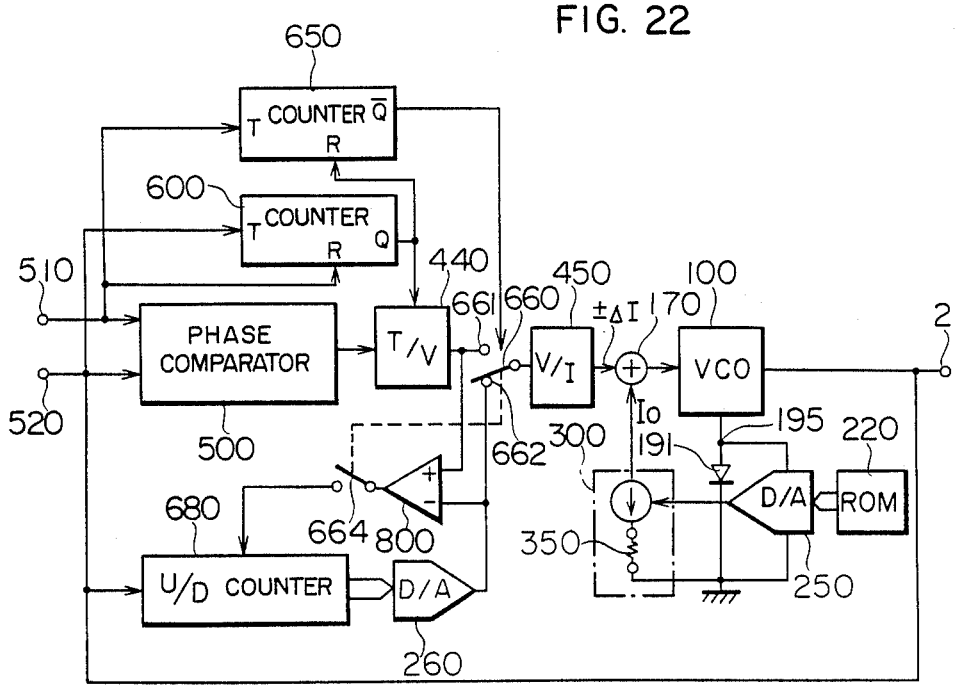
FIG. 22 is a block diagram of a modification of a PLL shown in FIG. 12.

FIG. 22 shows a modification of the PLL of FIG. 12 in block form. In this figure, like reference numerals refer to like elements of FIG. 12. The PLL of FIG. 22 includes, in addition to the PLL of FIG. 12, a D/A converter circuit 260, a counter (timer) 650, a switch 660, an up-down (U/P) counter 680, and a comparator 800. In this embodiment also, the VCO oscillates at the frequency $f_0$ defined by the voltage dividing ratio which is decided by ROM 220.

Meanwhile, in the PLL of FIG. 12, when the input signal disappears, VCO 100 always oscillates at a fixed central frequency $f_0$ recovered. Therefore, if there is a difference between the center frequency and the frequency of the input signal to the terminal 520 when the input signal disappears, this difference may cause disturbance when the control current for the VCO is changed from $(I+\Delta I)$ to $I_0$. To obviate such such disturbance, this embodiment, when the input signal disappears, intends to hold the VCO oscillation frequency before it disappears.

Figure 23:
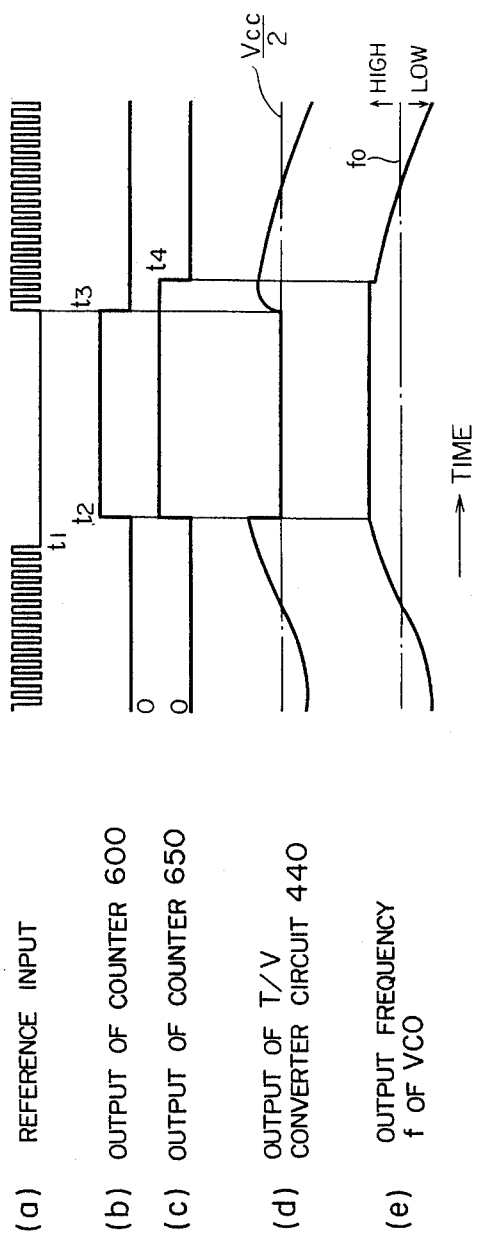
FIG. 23 is a waveform chart at the respective positions of a PLL of FIG. 22.

The operation of this modification will be explained with reference to the waveform chart of FIG. 23 which shows the waveforms at the respective positions of the circuit of FIG. 22. When the reference input signal 510 is being supplied to the terminal 510, the movable segment of the switch 660 is in contact with a terminal 661, and the switch 664 is closed. Therefore, the output of the T/V conversion circuit 440 is sent to the U/P counter 680 through the comparator 800 to control the count in the counter 680. On the other hand, the output of the counter 680 via the D/A converter 260 is compared with the output of the T/V conversion circuit 440 to provide the difference therebetween to the counter 680. Thus, the count in the counter 680 is precisely tracked by the output of the T/M conversion circuit 440.

In this state, when the reference input signal disappears (at the time of $t_1$ in FIG. 23), the counter 600 supplies a time-out signal to the T/V conversion circuit 440 after a predetermined time, i.e. at the time of $t_2$, so that the T/V conversion circuit is reset. Then, the output thereof is $Vcc/2$, and thus the output of the T/I conversion circuit 400, i.e., the output current of the V/I conversion circuit 450 is zero. Simultaneously, the counter 650 is also reset by the time-out signal. Then, the Q output thereof switches the movable segment of the switch 660 into the side of terminal 662, and the switch 664 is opened. Therefore, the input of the V/I conversion circuit is connected with the output of the D/A converter circuit 260, which is holding the output of the T/V conversion circuit 440 immediately before the reference input signal disappears, so that the oscillation frequency of the VCO is held at the value immediately before the reference input signal disappears. Thereafter, when the reference input signal is recovered at the time of $t_3$, the counter 600 is reset and the resetting of the T/V conversion circuit 440 is cancelled so that the output of the T/V conversion circuit 440 becomes the value corresponding to the phase difference from the phase comparator 500 in a normal operation mode. At the time of $t_4$ before a predetermined time, the resetting of the counter 650 is cancelled and the switches 660 and 664 are also switched so that the output of the V/I conversion circuit 450 is controlled by the output of the T/V conversion circuit 440. In this way, as shown in (e) of FIG. 23 the oscillation frequency of the VCO, when the reference input disappears, is completely bumpless, and also when the reference input is recovered, the disturbance can be minimized.

In accordance with this embodiment, under the condition close to the condition of using a PLL, a VCO can be automatically trimmed to provide good linearity and fixed loop gain. Therefore, (1) the influence from the variation of circuit elements can be removed, thereby improving the production yield; (2) the accuracy of the loop gain is high so that users can set the frequency to be used, without any adjustment; (3) the resistance of a single frequency setting resistor has only to be varied to employ the VCO in the wide range of frequencies as required, thereby improving the economy thereof; (4) even when an input signal disappears, a prescribed center frequency can be assured so that disturbance for the system can be decreased; (5) since the is always activated from the center frequency, the pull-in thereof in the system can be completed within a time as short as, e.g., several tens clocks; (6) the completion of trimming confirms the perfection of the main parts of the PLL so that it can also effectively test the PLL; and (7) the VCO is well adapted to integration, thereby allowing an effective trimming. Thus, a high performance PLL can easily be provided at low cost.

We claim:

1. A voltage controlled oscillator (VCO) comprising:
a first and a second gain stage which constitute a positive feedback path;
a first and a second load which are connected with said first and said second gain stage, respectively, so as to serve as loads for the corresponding gain stages, each of said loads being constituted by a parallel connection of an active device and a clamping diode;
a first and a second buffer stage which are connected with said first and said second load and with said second and first gain stage, respectively;
a first and a second voltage controlled current source which are connected with said first and said second gain stage, respectively so as to supply constant currents thereto; and
a timing capacitor connected between said first and said second voltage controlled constant current source so as to be alternately charged or discharged by the constant currents from said current sources, said timing capacitor, in a first operation state, being charged by the current flowing from said first gain stage to said first current source and from said first gain stage to said timing capacitor and said second current source, and being, in a second operation state, charged by the current flowing from said second gain stage to said second current source and from said second gain stage to said timing capacitor and said first current source, said first and said second state being alternately repeated, and
first and second variable bias generating means which are connected with said first and said second buffer stage, respectively so as to apply variable bias voltages to the active devices of said second and said first load, respectively, said first variable bias generating means, in said first and said second state, applying a second and a first bias voltage to the active device of said second load, respectively, said second variable bias generating means, in said first and said second state, applying said first and said second bias voltage to the active device of said first load, said first bias voltage being set in accordance with the constant current value of said current sources so as to set the on-resistance of the corresponding active devices to a prescribed value, whereby the loop gain is made constant regardless of said constant current value.

2. A VCO according to claim 1, wherein each of said first and said second variable bias means is a differential amplifier having a first and a second amplifier, a control input of said first amplifier is connected with the output of the corresponding buffer means, a control input of said second amplifier is applied with a reference voltage, one of said first and said second amplifier is connected with a D.C. power source while the other thereof is connected with the D.C. power source through voltage dividing means, and the output of said voltage dividing means is applied to said corresponding active device as a variable bias voltage.

3. A VCO according to claim 2, wherein said first and said second load are directly connected with said D.C. power source, and said variable bias generating means is connected with said D.C. power source through another active device.

4. A VCO according to claim 2, wherein said first and said second buffer means and said first and said second variable bias generating means are supplied with the constant current from the corresponding voltage controlled current sources which are controlled by a common control voltage.

5. A VCO according to claim 2, wherein the oscillation frequency thereof is controlled by the constant current value of said current sources, and said first bias voltage is set by adjusting the voltage dividing ratio of said voltage dividing circuit in accordance with said constant current value.

6. A voltage controlled oscillator comprising:
an oscillator section including
a first and a second gain stage which constitute a positive feedback path;
a first and a second load which are connected with said first and said second gain stage so as to serve as loads for the corresponding gain stages, each of said loads being constituted by a parallel connection of a resistor and a clamping diode;
a first and a second buffer stage which are connected with said first and said second load and with said second and said first gain stage, respectively;
a current mirror circuit connected with said first and said second gain stage, having a first and a second current control current source for supplying constant currents thereto; and
a timing capacitor connected between said first and said seqond current-controlled constant current source so as to be alternately charged or discharged by the constant currents from said current sources, said timing capacitor, in a first operation state, being charged by the current flowing from said first gain stage to said first current source and from said first gain stage to said timing capacitor and said second current source, and being, in a second operation state, charged by the current flowing from said second gain stage to said second current source and from said second gain stage to said timing capacitor and said first current source, said first and said second state being alternately repeated, and
a bias control circuit section including
clamping voltage detection means for equivalently detecting the voltage drop across said clamping diode;
resistor means for current detection connected with the control input of said current mirror; and
differential amplifier means for controlling the current flowing through said resistor means so that the difference between the voltage detected by said clamping voltage detection means and the voltage drop across said resistor is zero; and,
wherein the constant currents from said first and said second sources flow through said clamping voltage detection means, the constant current value being controlled in accordance with the current flowing through said resistor means.

7. A VCO according to claim 6, wherein said clamping voltage detection means is a diode connected in series with said oscillator section and detects the voltage drop across said diode as a clamping voltage.

8. A VCO according to claim 6, wherein said clamping voltage detection means directly detects the voltage drop across said clamping diode and supplies it to said differential amplifier means as a clamping voltage.

9. A voltage controlled oscillator (VCO) comprising:
an oscillator section including
a first and a second gain stage which constitute a positive feedback path;
a first and a second load which are connected with said first and said second gain stage so as to serve as loads for the corresponding gain stages, each of said loads being constituted by a parallel connection of a resistor and a clamping diode;
a first and a second current controlled constant current source; and
a timing capacitor connected between said first and said second current-controlled constant current source so as to be alternately charged or discharged by the constant currents from said current sources, said timing capacitor, in a first operation state, being charged by the current flowing from said first gain stage to said first current source and from said first gain stage to said timing capacitor and said second current source, and being, in a second operation state, charged by the current flowing from said second gain stage to said second current source and from said second gain stage to said timing capacitor and said first current source, said first and said second state being alternately repeated; and
voltage dividing means connected with said first and said second current sources;
a constant current circuit for supplying, to the common control input of said first and said second current sources, the output current thereof corresponding to the output voltage of said voltage dividing means having frequency setting resistor means; and
trimming means for setting a voltage dividing ratio of said dividing means to provide a predetermined linear input/output characteristic of said oscillator section.

10. A VCO according to claim 9, wherein said constant current circuit includes differential amplifier means for controlling the current flowing through said setting resistor means so that the difference between the output voltage of said voltage dividing means and the voltage drop across the resistor means is zero, and supplies, to the common control input of said first and said second current source, the current corresponding to the current flowing through said resistor means.

11. A VCO according to claim 9, wherein said voltage dividing means is a ROM.

12. A VCO according to claim 9, wherein the central oscillation frequency of said oscillator section is decided by the current flowing in said resistor means, which is defined by the resistance of said resistor means and the dividing ratio of said voltage dividing means.

13. A phase locked loop (PLL) comprising:
- a frequency-variable oscillator the oscillation frequency of which varies in accordance with a control input;
- constant current generating means for generating a constant current signal which defines the central frequency of said oscillator;
- a phase comparator for receiving the output of said oscillator and a reference input to provide an output corresponding to the phase difference therebetween;
- converter means for converting the output of said phase comparator into a D.C. signal;
- reference input disappearance detecting means for detecting disappearance of said reference input to hold the output of said conversion means at zero until the reference input is recovered; and
- addition means for adding the outputs of said conversion means and said constant current generating means to provide the sum thus obtained to said oscillator as a control input.

14. A PLL according to claim 13, wherein said constant current generating means comprises:
- voltage dividing means which as supplied with an operation current of said oscillator;
- a constant current circuit for supplying, to the control input of said oscillator, the output current corresponding to the output current of said voltage dividing means and having frequency setting resistor means; and
- trimming means for setting a voltage dividing ratio of said dividing means to provide a predetermined linear input/output characteristic of said oscillator.

15. A PLL according to claim 14, wherein said constant current circuit includes differential amplifier means for controlling the current flowing through said setting resistor means so that the difference between the output voltage of said voltage dividing means and the voltage drop across the resistor means is zero, and supplies to said control input the current corresponding to the current flowing in said resistor means.

16. A PLL according to claim 14, wherein said voltage dividing means is a ROM.

17. A PLL according to claim 14, wherein the central oscillation frequency of said oscillator is decided by the current flowing in said resistor means, which is defined by the resistance of said resistor means and the dividing ratio of said voltage dividing means.

18. A PLL according to claim 13 further comprising:
- holding means for holding the output of said conversion means,
- switch means for selecting one of the output of said holding means and the output of said conversion means, and
- said detecting means, until said reference input is recovered after the reference input has disappeared, controls said switch so that the output of said holding means instead of the output of the conversion means is supplied to said addition means.

19. A PLL according to claim 18, wherein said detecting means, at a predetermined time after the reference input has been recovered, controls said switch so that the output of said conversion means instead of the output of said holding means is supplied to said addition means.

20. A PLL according to claim 18, wherein said holding means stores an always renewed output of said conversion means.

* * * * *